(12) United States Patent
Boyer et al.

(10) Patent No.: US 7,018,870 B2
(45) Date of Patent: Mar. 28, 2006

(54) LASER DIODE AND HEATSINK QUICK CONNECT/DISCONNECT ASSEMBLY

(75) Inventors: Thomas R. Boyer, Gambrills, MD (US); Bradley Paul Davidson, Joppa, MD (US)

(73) Assignee: CIENA Corporation, Linthicum, MD (US)

( * ) Notice: Subject to any disclaimer, the term of this patent is extended or adjusted under 35 U.S.C. 154(b) by 125 days.

(21) Appl. No.: 10/720,287

(22) Filed: Nov. 25, 2003

(65) Prior Publication Data

US 2004/0075162 A1    Apr. 22, 2004

Related U.S. Application Data

(62) Division of application No. 09/916,172, filed on Jul. 26, 2001, now Pat. No. 6,730,993.

(51) Int. Cl.
  *H01L 21/44* (2006.01)
(52) U.S. Cl. ............... 438/122; 438/26; 438/64; 438/121
(58) Field of Classification Search ............ 438/26, 438/27, 64, 65, 111, 112, 121, 122, 125
  See application file for complete search history.

(56) References Cited

U.S. PATENT DOCUMENTS

| | | | |
|---|---|---|---|
| 4,342,068 A | | 7/1982 | Kling |
| 5,621,615 A | | 4/1997 | Dawson et al. |
| 6,084,178 A | * | 7/2000 | Cromwell ............ 29/447 |
| 6,252,726 B1 | * | 6/2001 | Verdiell ............ 359/820 |
| 6,304,450 B1 | | 10/2001 | Dibene et al. |
| 6,404,042 B1 | | 6/2002 | Sone et al. |

\* cited by examiner

*Primary Examiner*—Kevin M. Picardat
(74) *Attorney, Agent, or Firm*—Dougherty Clements; Christopher L. Bernard; Tyler S. Brown

(57) ABSTRACT

A connect and disconnect assembly for connecting and disconnecting a laser diode having leads to a printed circuit board (PCB). The assembly includes a heatsink having a base plate portion and fins extending from and integral with the base plate portion. The heatsink further includes spacer sleeves extending from a side of the base plate portion opposing the fins. The heatsink connects to the printed circuit board by providing mount screws through the heatsink and spacer sleeves which are received in mount holes formed in the PCB. The laser diode connects to the base plate portion of the heatsink. Laser support blocks connect with the heatsink and support opposing sides of the laser diode. Each laser support block is provided with a dielectric gasket. When the heatsink is mounted onto the PCB, the laser diode leads are forced against corresponding pads provided on the PCB for electrically connecting the laser diode to the PCB. The dielectric gaskets provide pressure on the laser diode leads so that they adequately contact their corresponding pads on the PCB, and electrically isolate and insulate the leads to prevent lead frequencies from intermixing. The assembly provides a convenient mechanism for connecting/disconnecting the laser diode and heatsink to/from the PCB. Further, the laser diode and assembly can be easily disconnected from the PCB so that a modified, repaired, and/or updated laser diode or other component can be quickly and easily inserted into the circuit without damaging or destroying the laser diode or the PCB.

5 Claims, 1 Drawing Sheet

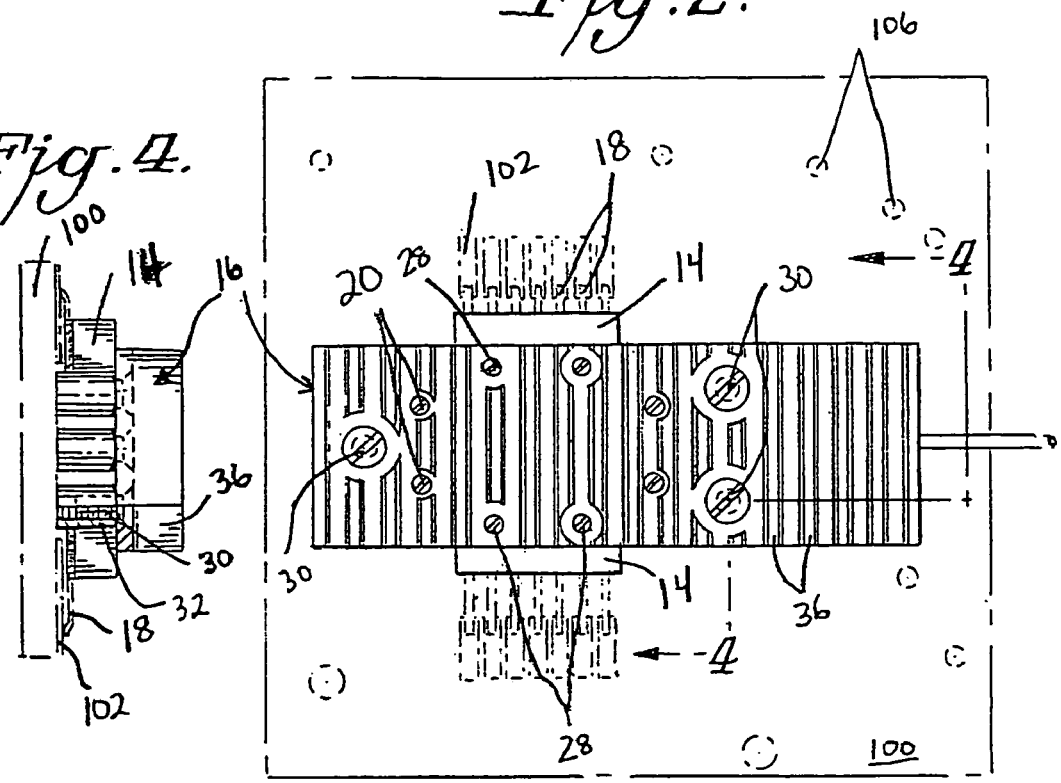
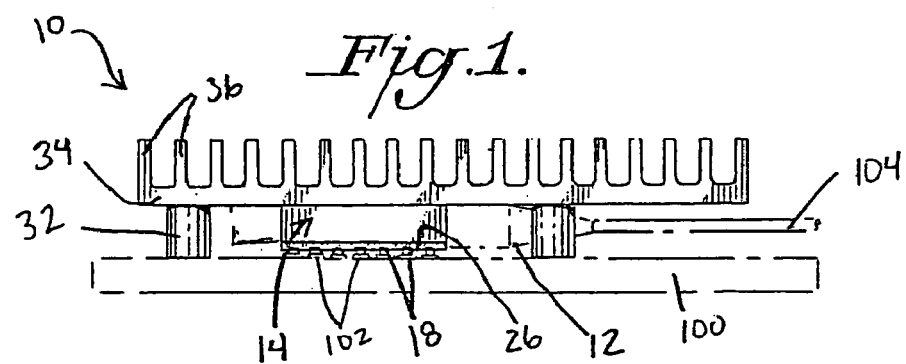
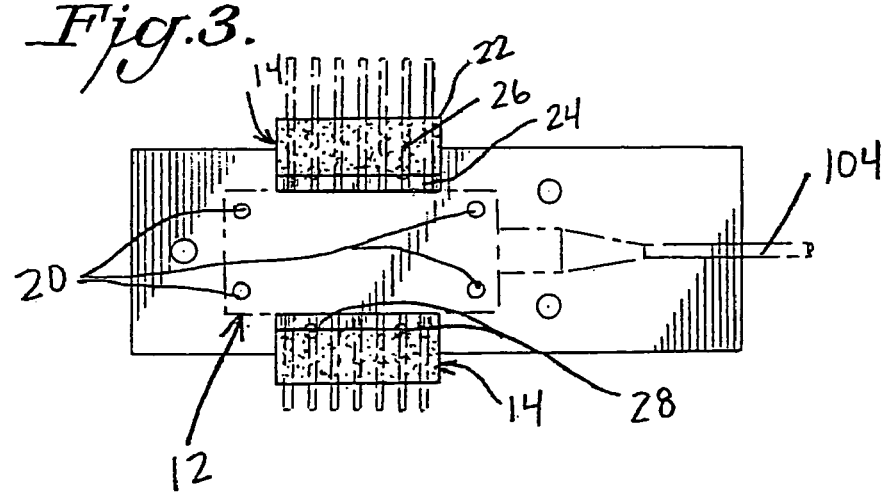

LASER DIODE AND HEATSINK QUICK CONNECT/DISCONNECT ASSEMBLY

This application is a Divisional of Application Ser. No. 09/916,172, filed on Jul. 26, 2001, now U.S. Pat. No. 6,730,993, the entire contents of which are hereby incorporated by reference and for which priority is claimed under 35 U.S.C. § 120.

BACKGROUND OF THE INVENTION

A. Field of the Invention

The present invention relates generally to the communications field, and, more particularly to an assembly for quickly connecting and disconnecting a laser diode, having a heatsink provided thereon, to a printed circuit board (PCB) used in the communications field.

B. Description of the Related Art

Printed circuit board (PCB) assemblies are used in computers, communications equipment, televisions, and many other products. In a typical PCB assembly, many electrical components are attached to the top and bottom surfaces of a PCB. Since the electronics manufacturing industry is highly competitive, it is important to maximize the throughput of processing PCB assemblies and to attach functional electrical components to the PCBs.

The manufacturing of PCB assemblies involves many processes, one of which is surface mounting components to PCBs. In addition to maximizing the throughput of processing PCB assemblies, it is also becoming important to accurately mount a large number of very small components to the PCB assemblies.

One major problem in mounting components on PCBs and the like is the connect/disconnect function. It is important that various components of the system be removable and/or possible to disconnect so that normal maintenance and testing, as well as changes and updates to the system, can be accomplished. Sometimes components that are permanently mounted onto a PCB (typically via soldering) may be defective. If such permanently-attached components are found to be defective, it is difficult to remove such components for repair without damaging or destroying the component and/or the PCB. Thus, it is essential that such components be easily removed from a PCB, without damaging or destroying the PCB, especially in the case where the component is defective.

One component that is typically permanently fixed (usually via soldering) onto a PCB is a laser diode. A laser diode, also known as an injection laser or diode laser, is a semiconductor device that produces coherent radiation at a center wavelength when current passes through it. Laser diodes are used in, for example, optical fiber systems, compact disc (CD) players, laser printers, remote-control devices, and intrusion detection systems.

Conventionally, a laser diode is provided with a heatsink. A heatsink is nothing more than a piece of metal that dissipates the heat generated by an optical or electronic component. There are three ways an object can dissipate heat: radiation, conduction, and convection.

Radiation, as the name suggests, means that the heat is simply radiated away from the object, through electromagnetic radiation (photon transport). This effect is not bound to gas or other substances surrounding the heatsink. Radiation will even take place in a vacuum. How well an object can radiate heat depends upon the material and the color.

Conduction is the exchange of kinetic energy between molecules. Less energetic (lower temperature) particles gain kinetic energy by colliding with more energetic particles (through physical contact). Since direct contact is required, a heatsink (surrounded by air) cannot get rid of significant amounts of heat using conduction. However, conduction is the effect that is responsible for the heat transfer from the hot component to the heatsink.

Convection is heat transfer by movement of a heated substance (gas or liquid). This means that the heat is transferred to the molecules of the gas (or liquid) surrounding the hot object, and then transported away through movement of molecules. If the gas or liquid around the object is forced into movement (e.g. by a fan blowing air across a heatsink), then this is called forced convection.

In a conventional arrangement as described generally in U.S. Pat. No. 5,324,387, a laser diode connects to a heatsink (usually with solder or screws), the heatsink connects to the PCB (usually with solder or screws), and the leads of the laser diode are soldered to the PCB to electrically couple the laser diode to the PCB. Once a laser diode is electrically coupled to the PCB, it is desirous to test the laser diode to see if it is functional. If the laser diode is defective or nonfunctional, it is further desirable to remove and repair, or remove and replace the defective laser diode. Unfortunately, if the leads of the defective laser diode are permanently soldered to the PCB, it is very difficult to remove the laser diode from the PCB without damaging or destroying the laser diode and/or the PCB.

Thus, there is a significant need in the art to provide a mechanism that temporarily attaches and electrically connects/disconnects a laser diode (or other electrical or optical component), having a heat sink provided thereon, to a PCB.

SUMMARY OF THE INVENTION

The present invention solves the problems of the related art by providing an assembly for quickly connecting and disconnecting a laser diode, having a heatsink provided thereon, to a printed circuit board (PCB) used, for example, in the communications field.

In accordance with the purpose of the invention, as embodied and broadly described herein, the invention comprises a connect and disconnect assembly for connecting and disconnecting a laser diode having at least one lead to a printed circuit board, including: a heatsink having a base plate portion and a plurality of fins extending from and integral with the base plate portion, the heatsink being connected to the printed circuit board, and the laser diode being connectable to the heatsink; and at least one laser support block interposed between the heatsink and the printed circuit board, wherein a portion of a connection force connecting the heatsink to the printed circuit board is transferred through the at least one laser support block to couple the at least one lead of the laser diode with at least one pad of the printed circuit board.

Further in accordance with the purpose of the invention, as embodied and broadly described herein, the invention comprises a method of connecting an assembly to a printed circuit board, the assembly including a heatsink having a base plate portion and a plurality of fins extending from and integral with the base plate portion, a laser diode having at least one lead, and at least one laser support block, comprising: connecting the laser diode to the heatsink; interposing the at least one laser support block between the heatsink and the printed circuit board; and connecting the heatsink to the printed circuit board, wherein a portion of a connection force connecting the heatsink to the printed circuit board is transferred through the at least one laser support block to couple the at least one lead of the laser diode with at least one pad of the printed circuit board.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a front elevational view of a laser diode and heatsink quick connect/disconnect assembly in accordance with an embodiment of the present invention, and shown attached to a printed circuit board (PCB);

FIG. 2 is a top plan view of the laser diode and heatsink quick connect/disconnect assembly shown in FIG. 1;

FIG. 3 is a bottom plan view of the laser diode and heatsink quick connect/disconnect assembly shown in FIGS. 1 and 2, and shown detached from the PCB; and FIG. 4 is a left side elevational and partial cross-sectional view of the laser diode and heatsink quick connect/disconnect assembly shown in FIGS. 1–3, taken along line 4—4 of FIG. 2.

DETAILED DESCRIPTION OF THE PREFERRED EMBODIMENTS

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Referring now specifically to the drawings, an embodiment of the laser diode and heatsink quick connect/disconnect assembly of the present invention is illustrated in FIGS. 1–4, and shown generally as reference numeral 10. As generally shown in FIG. 1, assembly 10 includes a laser diode 12, a pair of laser support blocks 14, and a heatsink 16.

As best shown in FIGS. 1–3, laser diode 12 may be a conventional laser diode that produces coherent radiation at a center wavelength when an electrical current passes through it. A multitude of leads 18 connect to laser diode 12. When assembly 10 is provided on a PCB 100, leads 18 may contact corresponding pads 102 on the PCB 100 to provide an electrical current from the PCB 100 to laser diode 12, via leads 18. Laser diode 12, in turn, converts the electrical current to an optical signal that may be provided to a fiber optic cable 104 connected to laser diode 12.

Laser diode 12 may connect to heatsink 16 via various connection mechanisms. For example, laser diode 12 may connect to heatsink 16 with an adhesive, glue, or double-sided tape. As shown in FIGS. 2 and 3, laser diode 12 may connect to heatsink 16 by providing four mount screws 20 through heatsink 16 and into laser diode 12.

As shown in FIGS. 2 and 3, laser support blocks 14 may be provided on opposite sides of laser diode 12. Each laser support block 14 includes a body portion 22 having a shoulder 24 provided therein. The body portion 22 of each laser support block 14, except where shoulder 24 is located, includes a gasket 26. Each laser support block 14 may connect to heatsink 16 with an adhesive, glue, or double-sided tape. As further shown in FIGS. 2 and 3, each laser support block 14 may connect to heatsink 16 by providing two mount screws 28 through heatsink 16 and into each laser support block 14.

Gaskets 26 provide pressure on leads 18 of laser diode 12 so that leads 18 adequately contact corresponding pads 102 on the PCB 100 to provide an electrical current from the PCB 100 to laser diode 12. This way, laser diode 12 may be tested without being permanently affixed to PCB 100. Gaskets 26 may be constructed from various materials, but preferably are made from a material that absorbs the force applied to leads 18 and electrically isolates and insulates leads 18 to prevent electrical signals and/or frequencies from leads 18 from intermixing. Such a material includes a microwave-absorbable and radar-absorbable (dielectric) material, such as the Magnetic Radar Absorbing Material, sold under the trade name MAGRAM by ARC Technologies, Inc., of Amesbury, Mass.

Laser support blocks 14 may be constructed from a variety of materials, including, but not limited to, for example, metal materials, thermoplastic materials, etc. Preferably, laser support blocks 14 are made from a material having good heat conduction to heatsink 16, such as for example, a metal material like aluminum or stainless steel.

Although laser support blocks 14 are shown connected to heatsink 16 with mount screws 28, laser support blocks 14 may be integrally formed with heatsink 16 or interposed between heatsink 16 and PCB 100. A portion of a connection force connecting heatsink 16 to printed circuit board 100 is transferred through laser support blocks 14 to couple leads 18 of laser diode 12 with corresponding pads 102 of PCB 100.

Heatsink 16 connects to laser diode 12 and laser support blocks 14 as described above. As shown in FIGS. 1, 2, and 4, heatsink 16, with laser diode 12 and laser support blocks 14 attached thereto, may connect to PCB 100 by providing screws, nuts and bold, or other similar connection mechanisms through heatsink 16 for connection with corresponding mount holes 106 formed in PCB 100. Preferably, screws 30 are provided through heatsink 16 and corresponding spacer sleeves 32, and engage corresponding mount holes 106 formed in PCB 100.

Spacer sleeves 32 maybe separately or integrally formed with heatsink 16. Since laser diode 12 and laser support blocks 14 are provided between heatsink 16 and PCB 100, spacer sleeves 32 ensure that heatsink 16 connects to PCB 100 at a height such that leads 18 of laser diode 12 contact pads 102 of PCB 100. Thus, the height of spacer sleeves 32 is dependent upon the height of laser diode 12, and may be adjusted accordingly.

As shown in FIGS. 1 and 2, heatsink 16 includes a base plate portion 34, and a plurality of heat dissipation fins 36 extending away from and integrally formed with base plate portion 34. Fins 36 aid the process of dissipating heat generated by laser diode 12, and the number, size, shape, and arrangement of fins 36 depends upon the desired heat dissipation to be provided by heatsink 16 for laser diode 12. That is, the more surface area of fins 36 that are provided, the more heat will be dissipated by heatsink 16. However, the desire to dissipate heat generated by laser diode 12 should be balanced with the desire not to overcool laser diode 12. Such a balance will depend upon the laser diode selected.

As shown in FIG. 2, base plate portion 34 of heatsink 16 may be rectangular shaped, although heatsink 16 may have a variety of other shapes, including circular, trapezoidal, or square. Heatsink 16 need not have any particular dimensions, but should be sized to provide the desired heat dissipation for laser diode 12. A larger heatsink 16 provides more heat dissipation than a smaller heatsink 16, but heatsink 16 should not be so large that it takes up too much valuable space on PCB 100. Thus, the size of heatsink 16 will be application dependent.

Heatsink 16 may be made from a variety of materials. Preferably, heatsink 16 is made of aluminum alloy due to its low cost, great mechanical characteristics, and lightweight nature. Although a pure metal has better thermal conductivity than an alloy, aluminum alloys have better mechanical characteristics than aluminum. Heatsink 16 may also be made from copper, copper alloy, or a copper and aluminum combination (where base plate portion 34 is made of copper or has a copper inlay, and fins 36 are made of aluminum).

In addition to these two factors, heatsink 16 may be designed in a such way that good thermal transfer is possible inside heatsink 16 (meaning that the heat can easily travel from the lower part of the base plate portion 34, that is in contact with laser diode 12, to fins 36, where the actual heat dissipation takes place). The part of heatsink 16 that is in contact with laser diode 12 should preferably be very flat in order to allow good thermal transfer. Typically, there will still be small air gaps in the contact area between laser diode 12 and heatsink 16. Therefore, a thermal interface material, like a thermal compound (paste) or a thermoconductive pad may be used between base plate portion 34 and laser diode 12.

To connect the laser diode and heatsink quick connect/disconnect assembly 10 to PCB 100, a user need only connect laser support blocks 14 to heatsink 16 with mount screws 28, and connect laser diode 12 to heatsink 16 with mount screws 20. Then the user connects heatsink 16 to PCB 100 by providing screws 30 through heatsink 16 and spacer sleeves 32 to engage mount holes 106 provided in PCB 100, temporarily connecting assembly 10 to PCB 100. Leads 18 from laser diode 12 align and contact with PCB pads 102 to electrically connect laser diode 12 to PCB 100. Fiber optic cable 104 may then be optically connected to laser diode 12. The operability of laser diode 12 may then be tested, without permanently attaching laser diode 12 to PCB 100. If laser diode 12 is defective, it may be disconnected from PCB 100, and repaired or replaced, without damaging PCB 100 or laser diode 12.

To disconnect assembly 10, a user need only disconnect fiber optic cable 104 from laser diode 12, remove or loosen screws 30 provided in mount holes 106 of PCB 100, and lift assembly 10 from PCB 100. Alternatively, the user may simply remove or loosen screws 24 and lift assembly, with fiber optic cable 104 attached to laser diode 12, from PCB 100. Laser diode 12 may then be disconnected from heatsink 16 by removing or loosening mount screws 20.

Thus, laser diode and heatsink quick connect/disconnect assembly 10 provides a very convenient mechanism for connecting/disconnecting a laser diode 12 and heatsink 16 to/from PCB 100 or the like, for testing laser diode 12. Further, laser diode 12 and assembly 10 can be easily disconnected from PCB 100 so that a modified, repaired, and/or updated components (e.g., a new or repaired laser diode 12), or components with different functions can be quickly and easily inserted into the circuit without damaging or destroying assembly 10 or PCB 100.

Once it is determined that laser diode 12 is operable, it may be permanently attached to PCB 100 by soldering leads 18 to corresponding pads 102 on PCB 100. Alternatively, quick connect/disconnect assembly 10 may be used for permanently attaching laser diode 12 to PCB 100. If laser diode 12 subsequently becomes defective, assembly 10 permits removal of the defective laser diode 12 from PCB 100 without damage to PCB 100 and laser diode 12. Defective laser diode 12 may then be repaired (or replaced) and reconnected to PCB 100 with assembly 10.

It will be apparent to those skilled in the art that various modifications and variations can be made in the laser diode and heatsink quick connect/disconnect assembly of the present invention and in construction of the assembly without departing from the scope or spirit of the invention. For example, the material selections discussed above are purely exemplary and not limiting of the embodiments of the present invention. The present invention is also not limited for use with a PCB, but may be used for coupling the assembly with integrated circuit (IC) chips, hybrid circuits, etc. Finally, the present invention may be used for components other than a laser diode, such as, for example, lasers with leads, photodiodes, etc. If a photodiode replaces laser diode 12, the photodiode would receive an optical signal from fiber optic cable 104, and convert the optical signal into an electrical signal. The electrical signal would then travel through leads 18 and enter PCB 100 through pads 102. The present invention is also not limited to use in the communications field, and may be used with any laser that attaches to a PCB and needs to be tested before permanently being attached to the PCB.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of connecting an assembly to a printed circuit board, the assembly including a heatsink having a base plate potion and a plurality of fins extending from and integral with the base plate portion, a laser diode having at least one lead, a plurality of interchangeable spacer sleeves, and at least one laser support block, comprising:
   connecting the laser diode to the heatsink;
   interposing the at least one laser support block between the heatsink and the printed circuit board;
   inserting a plurality of threaded connection mechanisms through apertures in the heatsink and providing each of the connection mechanisms with one of the plurality of interchangeable spacer sleeves thereabout; and
   connecting the heatsink to mount holes in the printed circuit board utilizing the plurality of threaded connection mechanisms, wherein a portion of a connection force connecting the heatsink to the printed circuit board is transferred through the at least one laser support block to couple the at least one lead of the laser diode with at least one pad of the printed circuit board.

2. A method of connecting an assembly to a printed circuit board as recited in claim 1, wherein the at least one laser support block connects to the heatsink.

3. A method of connecting an assembly to a printed circuit board as recited in claim 1, wherein the assembly is temporarily connected to the printed circuit board.

4. A method of connecting an assembly to a printed circuit board as recited in claim 1, further comprising:
  connecting a fiber optic cable to the laser diode;
  converting an electrical signal provided by the at least one lead into an optical signal in the laser diode; and
  providing the optical signal to the fiber optic cable.

5. A method of connecting an assembly to a printed circuit board as recited in claim 1, wherein said threaded connection mechanism is a screw, a nut, or a bolt.

* * * * *